United States Patent
Riehl et al.

(10) Patent No.: US 10,084,345 B2
(45) Date of Patent: Sep. 25, 2018

(54) RESONANT WIRELESS POWER DRIVER WITH ADJUSTABLE POWER OUTPUT

(71) Applicant: MediaTek Singapore Pte. Ltd., Singapore (SG)

(72) Inventors: Patrick Stanley Riehl, Cambridge, MA (US); Anand Satyamoorthy, Somerville, MA (US); Yung-Chih Yen, Tainan (TW)

(73) Assignee: MEDIATEK Singapore Pte. Ltd., Solaris (SG)

( * ) Notice: Subject to any disclaimer, the term of this patent is extended or adjusted under 35 U.S.C. 154(b) by 91 days.

(21) Appl. No.: 14/771,956

(22) PCT Filed: Mar. 14, 2014

(86) PCT No.: PCT/US2014/026952
§ 371 (c)(1),
(2) Date: Sep. 1, 2015

(87) PCT Pub. No.: WO2014/152103
PCT Pub. Date: Sep. 25, 2014

(65) Prior Publication Data
US 2016/0013660 A1     Jan. 14, 2016

Related U.S. Application Data (60) Provisional application No. 61/782,604, filed on Mar. 14, 2013.

(51) Int. Cl.
*H01F 27/42* (2006.01)
*H02J 50/12* (2016.01)
(Continued)

(52) U.S. Cl.
CPC .............. *H02J 50/12* (2016.02); *H02J 5/005* (2013.01); *H02J 17/00* (2013.01); *H03F 3/2171* (2013.01); *H03F 3/2176* (2013.01)

(58) Field of Classification Search
CPC .......... H02J 5/005; H02J 17/00; H03F 3/2171; H03F 3/2176
(Continued)

(56) References Cited

U.S. PATENT DOCUMENTS

2004/0080364 A1   4/2004 Sander et al.
2010/0176659 A1   7/2010 Aoyama et al.
(Continued)

FOREIGN PATENT DOCUMENTS

CN   102355032       2/2012
CN   202652152 U     1/2013
(Continued)

OTHER PUBLICATIONS

Extended European Search Report for Application No. EP 14771075.0 dated Jan. 8, 2016.
(Continued)

*Primary Examiner* — Thomas Skibinski
(74) *Attorney, Agent, or Firm* — Wolf, Greenfield & Sacks, P.C.

(57) ABSTRACT

A resonant wireless power (RWP) system is provided that includes a signal generator that provides an input signal waveform. An amplifier structure amplifies signals for transmissions to a receiver that is powered from a fixed DC voltage supply. The amplifier structure is operated either using differential or single-ended amplifiers to provide two different output power levels, in burst mode to provide a range of output power levels, or using a capacitor in a matching network that is adjusted to provide a range of output power levels.

16 Claims, 8 Drawing Sheets

(51) Int. Cl.
*H02J 17/00* (2006.01)
*H02J 5/00* (2016.01)
*H03F 3/217* (2006.01)

(58) Field of Classification Search
USPC ........ 307/104; 375/295–308; 455/41.1, 41.2, 455/41.3
See application file for complete search history.

(56) References Cited

U.S. PATENT DOCUMENTS

| | | |
|---|---|---|
| 2010/0184371 A1* | 7/2010 | Cook .................... H02J 5/005 455/41.1 |
| 2010/0190435 A1 | 7/2010 | Cook et al. |
| 2012/0228959 A1 | 9/2012 | Mayo et al. |
| 2012/0300872 A1 | 11/2012 | Kim et al. |
| 2012/0300875 A1 | 11/2012 | Kwon et al. |
| 2013/0033118 A1 | 2/2013 | Karalis et al. |
| 2014/0035384 A1 | 2/2014 | Satyamoorthy et al. |

FOREIGN PATENT DOCUMENTS

| | | |
|---|---|---|
| WO | WO 2012-111969 | 8/2012 |
| WO | WO 2012/111969 A2 | 8/2012 |

OTHER PUBLICATIONS

International Search Report and Written Opinion for Application No. PCT/US2014/026952 dated Jul. 14, 2014.
International Preliminary Report on Patentability for Application No. PCT/US2014/026952 dated Sep. 24, 2015.

* cited by examiner

RESONANT WIRELESS POWER DRIVER WITH ADJUSTABLE POWER OUTPUT

PRIORITY INFORMATION

This application is a National Phase Application of PCT Application no. PCT/US2014/026952, filed on Mar. 14, 2014, which claims priority from provisional application Ser. No. 61/782,604 filed Mar. 14, 2013, which are incorporated herein by reference in their entireties.

BACKGROUND OF THE INVENTION

The invention is related to the field of resonant wireless power (RWP), and in particular to a RWP driver with adjustable power output.

Wireless power (WP) transfer systems use the mutual inductance between two magnetic coils to transfer power through magnetic induction. These systems are commonly classified as either "inductive" or "resonant". In a purely inductive wireless power transfer system, the source coil, which functions as the primary winding of a transformer, is driven by a voltage or current source. The receive coil, which functions as the secondary winding, is connected to a bridge rectifier, either directly or through an ac-coupling capacitor. The voltages and currents in the two windings can be determined by the relations commonly used to describe transformers.

In a resonant wireless power (RWP) transfer system, the source and receiver coils are connected to capacitors to form electrical resonators. From a circuit-design standpoint, the function of the capacitors is to cancel some of the reactive impedance of the inductors, allowing more power to be transferred at a given voltage. The impedance of the inductors and capacitors varies in opposite directions with operating frequency, so the cancellation is only effective over a small range of frequencies. In other words, resonant wireless power systems utilize circuits tuned to a specific frequency at which power is to be transferred. They typically do not allow power transfer at other frequencies.

In order to operate a RWP system at high efficiency over a wide range of loading conditions, the power output from the wireless power source must be adjustable. Operating the source at too low of a power level may result in insufficient power to supply the receiver devices. Operating it at too high of a power level may result in excess circulating currents, causing wasted energy.

For MHz-frequency RWP sources, a Class-E amplifier is often used to convert dc power to ac. The Class-E amplifier is only efficient at one particular duty cycle, so it is not possible to use duty cycle control to modulate power. Nor is it typically possible to vary frequency, as the receiver devices are all tuned to a specific frequency. The best-known methodology for adjusting power level is to introduce a dc-dc converter between the input dc power supply and the Class-E amplifier. However, this dc-dc converter will introduce some efficiency loss as well as adding complexity to the design of the source electronics.

SUMMARY OF THE INVENTION

According to one aspect of the invention, there is provided a resonant wireless power (RWP) system. The RWP system includes a signal generator that provides an input signal waveform; amplifier structure that amplifies signals for transmissions to a receiver. The amplifier structure is powered from a fixed DC voltage supply. The amplifier structure is operated either using differential or single-ended amplifiers to provide two different output power levels, in burst mode to provide a range of output power levels, or using a capacitor in a matching network that is adjusted to provide a range of output power levels.

According to another aspect of the invention, there is provided a method of controlling the power of a resonant wireless power (RWP) system. The method includes providing an amplifier structure that is powered from a fixed DC voltage supply. The amplifier structure is operated either using differential or single-ended amplifiers to provide two different output power levels, in burst mode to provide a range of output power levels, or using a capacitor in a matching network that is adjusted to provide a range of output power levels.

DETAILED DESCRIPTION OF THE INVENTION

The invention relates to circuits and methods for controlling the power from the Class-E amplifier without using duty-cycle control, frequency variation or a dc-dc converter.

Figure 1:
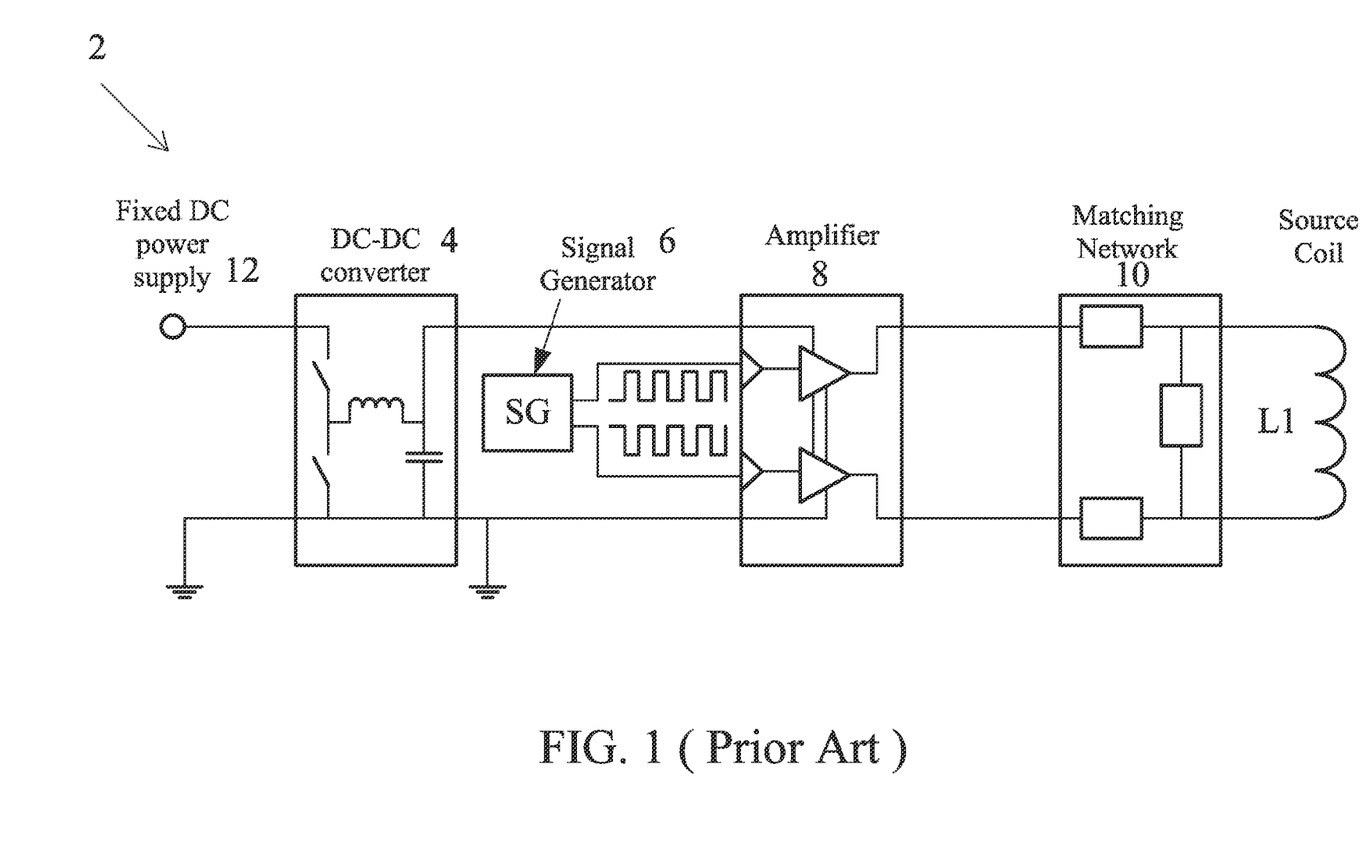
FIG. 1 is a schematic block diagram illustrating a typical RWP transmitter.

FIG. 1 shows a block diagram of a typical RWP transmitter 2. A fixed dc voltage 12 provides the power input to the transmitter. A dc/dc converter 4 transforms this fixed dc voltage 12 to the voltage level required by an amplifier 8. A signal generator 6 provides the phase and frequency reference signals to the amplifier input.

In a typical embodiment of an RWP transmitter 2, these signals consist of two square waves of continuous fixed frequency with opposite phase. The amplifier 8 produces output power drawn from the dc/dc output at the frequency of the signal generator 6. The output power of the amplifier 8 is conveyed through a matching network 10 into the source coil L1. The matching network 10 provides an impedance match between the amplifier 8 and source coil L1, ensuring an efficient delivery of power to the source coil L1. When a matched receiver coil is coupled to the source coil L1, it may receive power wirelessly through the magnetic coupling.

Depending on the conditions of operation of the wireless power system, the power required from the source may vary over some range. In the system of FIG. 1, the conventional method to vary the amplifier output power is to vary the voltage at the amplifier input. The dc/dc converter 4 is only required because of the need to vary amplifier output power.

If output power can be varied using a fixed voltage supply 12, the dc/dc converter 4 can be eliminated, thus improving efficiency and reducing system complexity. Although frequency and duty-cycle modulation have been used in inductive charging systems to vary source power, these techniques are not suitable to highly resonant systems. Note the amplifier 8 can include any class of amplifier, such Class-D, E, F amplifiers.

Figure 2:
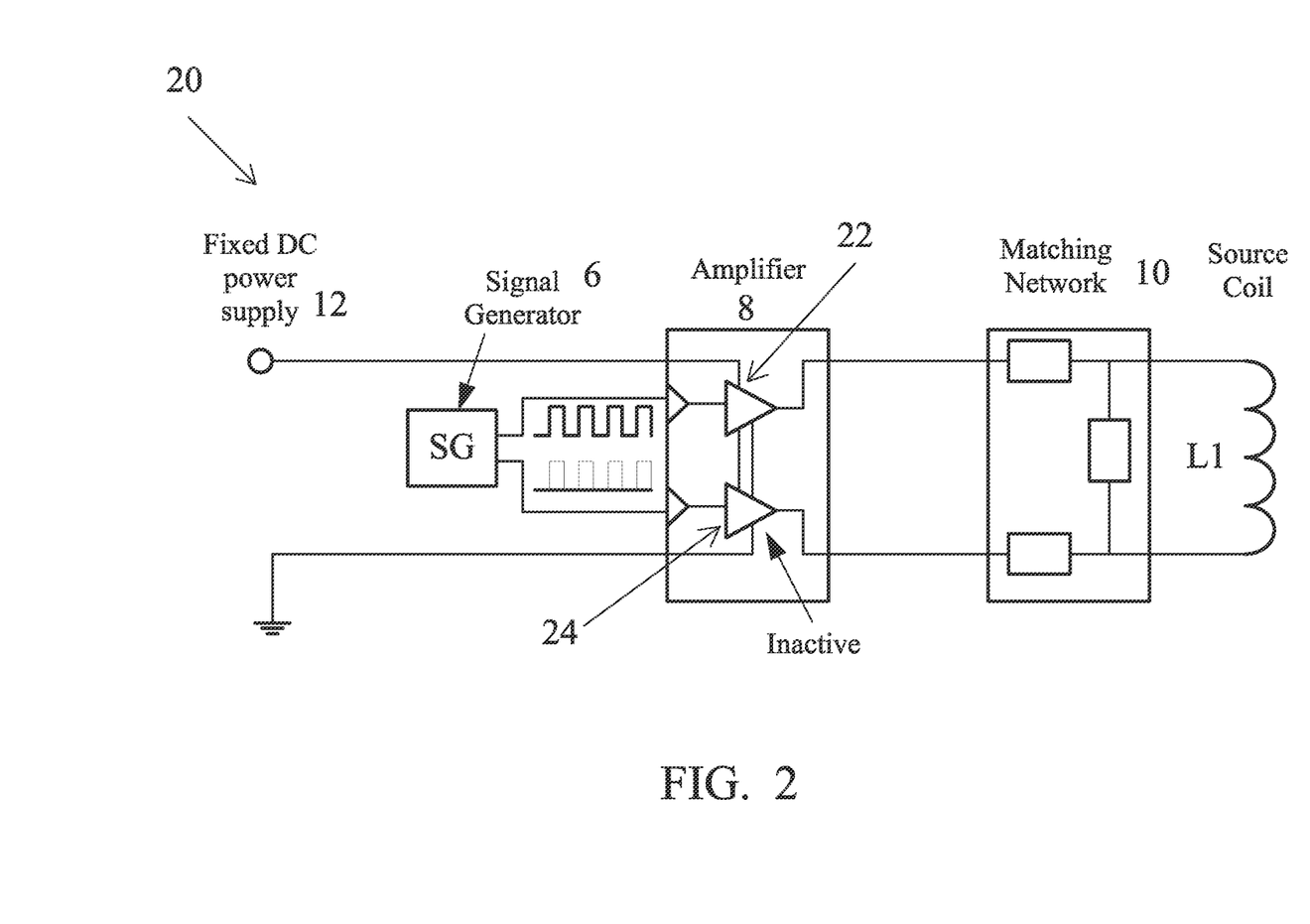
FIG. 2 is a schematic diagram illustrating one embodiment of the invention for varying the output power of the amplifier.

FIG. 2 shows one embodiment 20 of the invention for varying the output power of the amplifier 8 without using input voltage, frequency or duty-cycle modulation. In this block diagram the amplifier 8 is powered directly from the fixed dc voltage 12—there is no dc-dc converter. The amplifier 8 shown is typically operated as a differential amplifier, producing equal and opposite output voltages. In fact, the amplifier 8 is composed of two component amplifiers 22, 24. If the signal generator 6 disables one of its frequency reference outputs, the corresponding component amplifier 24 can be made inactive. As a result, the output power from the amplifier 8 can be reduced by half. This provides two levels of output power adjustment, which may be sufficient for some basic wireless power systems.

Figure 3:
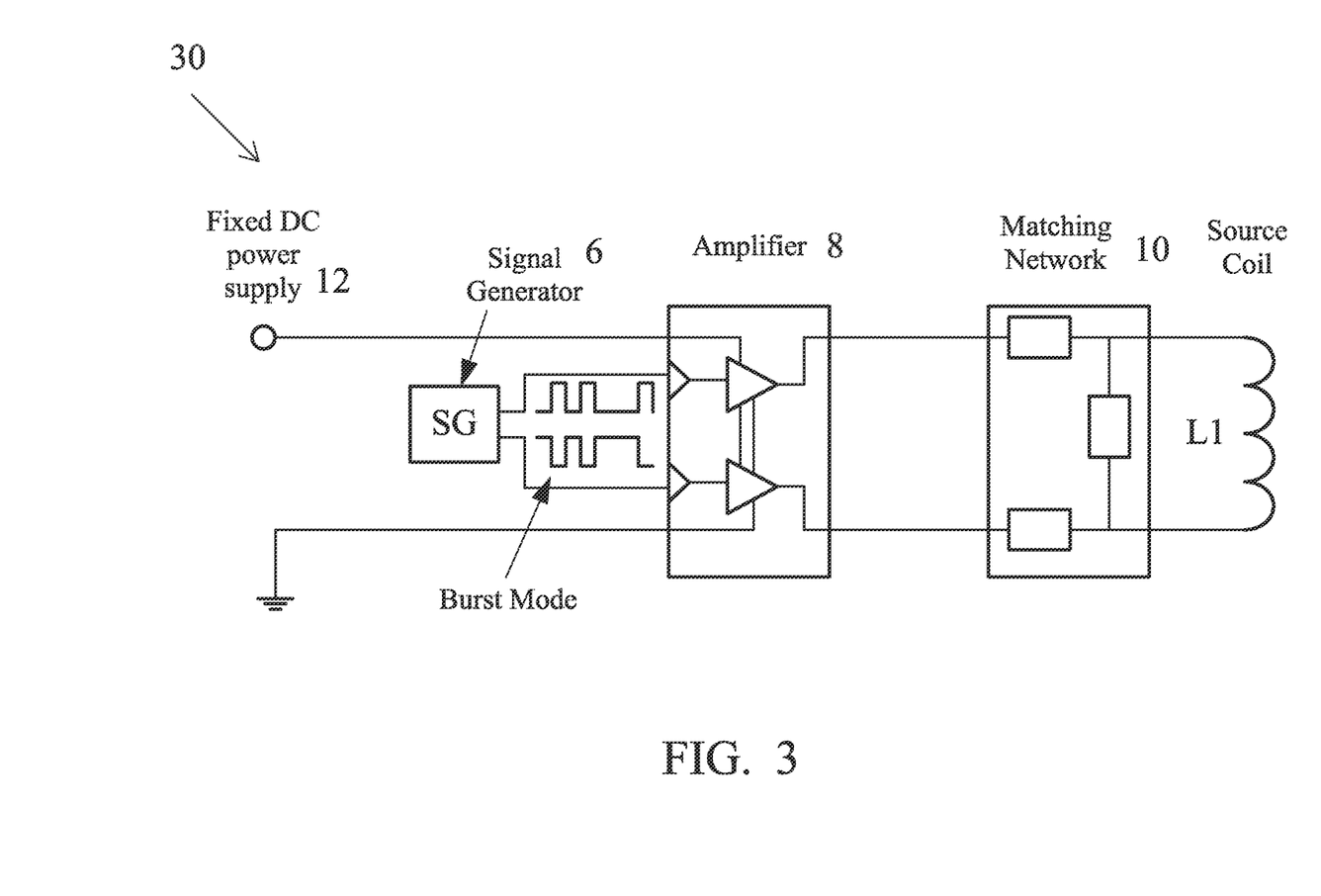
FIG. 3 is a schematic diagram illustrating a second embodiment of the invention for varying the source output power.
Figure 4:
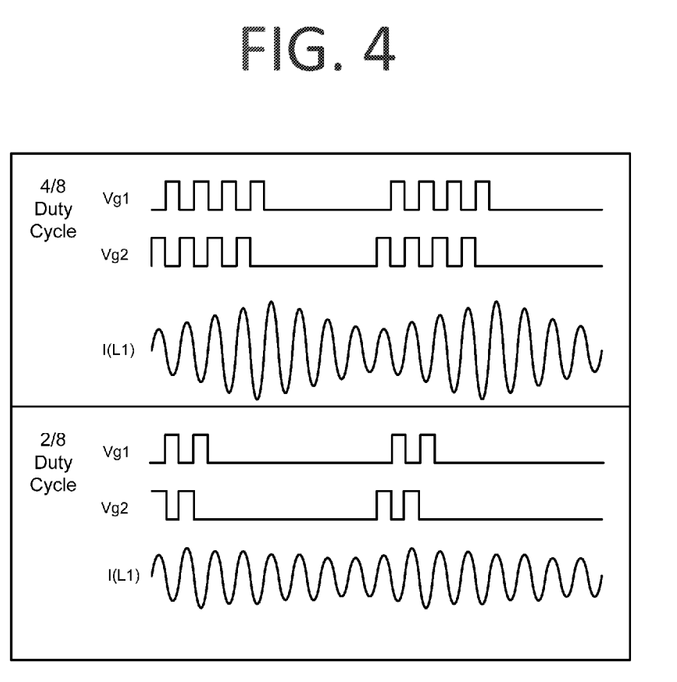
FIG. 4 is a graph illustrating properties of the burst mode.

FIG. 3 shows another embodiment 30 for varying the source output power. As in the technique described in FIG. 2, the amplifier 8 is powered from a fixed dc voltage 12. In this method, the frequency reference provided by the signal generator 6 is not a continuous square wave, but rather a sequence of bursts of pulses at the operation frequency, interleaved with periods of inactivity. An example of this burst-mode operation is shown in FIG. 4. The waveforms Vg1 and Vg2 represent the frequency references supplied to the top and bottom side of the differential amplifier, respectively. In the section of the figure labeled "4/8 Duty Cycle", there is a burst of four pulses followed by an idle period. The overall pattern repeats with a period of eight pulse periods. During the burst, the inductor current IL ramps up as power is injected into the resonant circuit. During the idle period, power ramps down. The average current in the inductor IL is lower than it would be for a continuous pulse train. In the section of the figure labeled "2/8 Duty Cycle", only two pulses are injected during a period of eight pulse periods. Since the ramp-up time of the inductor current is smaller, the average inductor current is lower than in the first case. In general, the higher the ratio of pulses to idle time, the higher the average inductor current. Thus the output power, which is proportional to inductor current, can be controlled by adjusting the pulse density.

Figure 5:
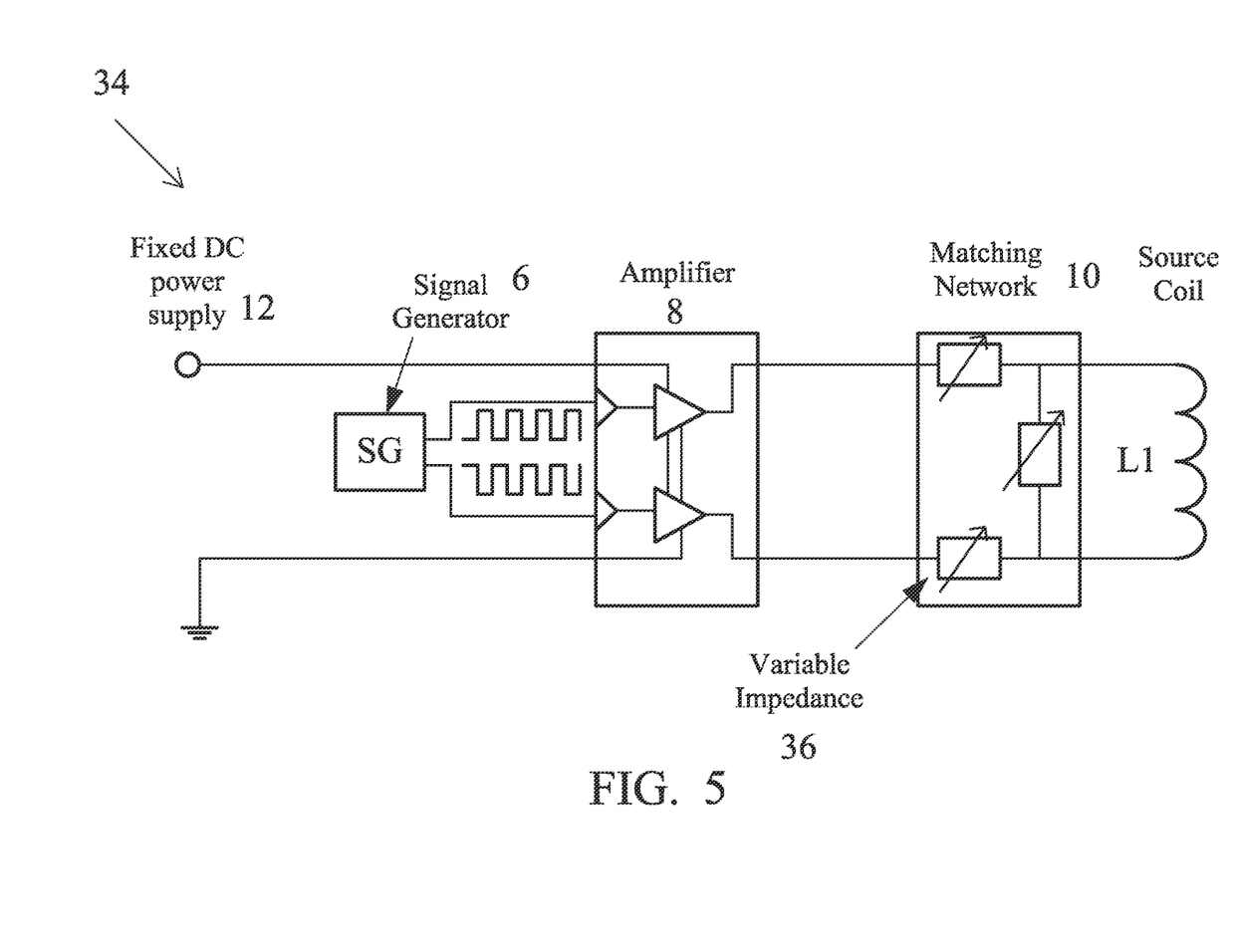
FIG. 5 is a schematic diagram illustrating a third embodiment of the invention for adjusting amplifier output power.

FIG. 5 shows another embodiment 34 of the invention for adjusting amplifier 8 output power. In this method, the amplifier input voltage is a fixed dc voltage 12 and the frequency reference is a continuous, fixed-frequency square wave. In this method, there are variable impedance elements 36 in the matching network 10. Varying these elements allows the power to the source coil L1 to be adjusted. In order to better understand this variable matching network technique, FIG. 6 shows the amplifier abstracted to an ac voltage source 48.

Figure 6:
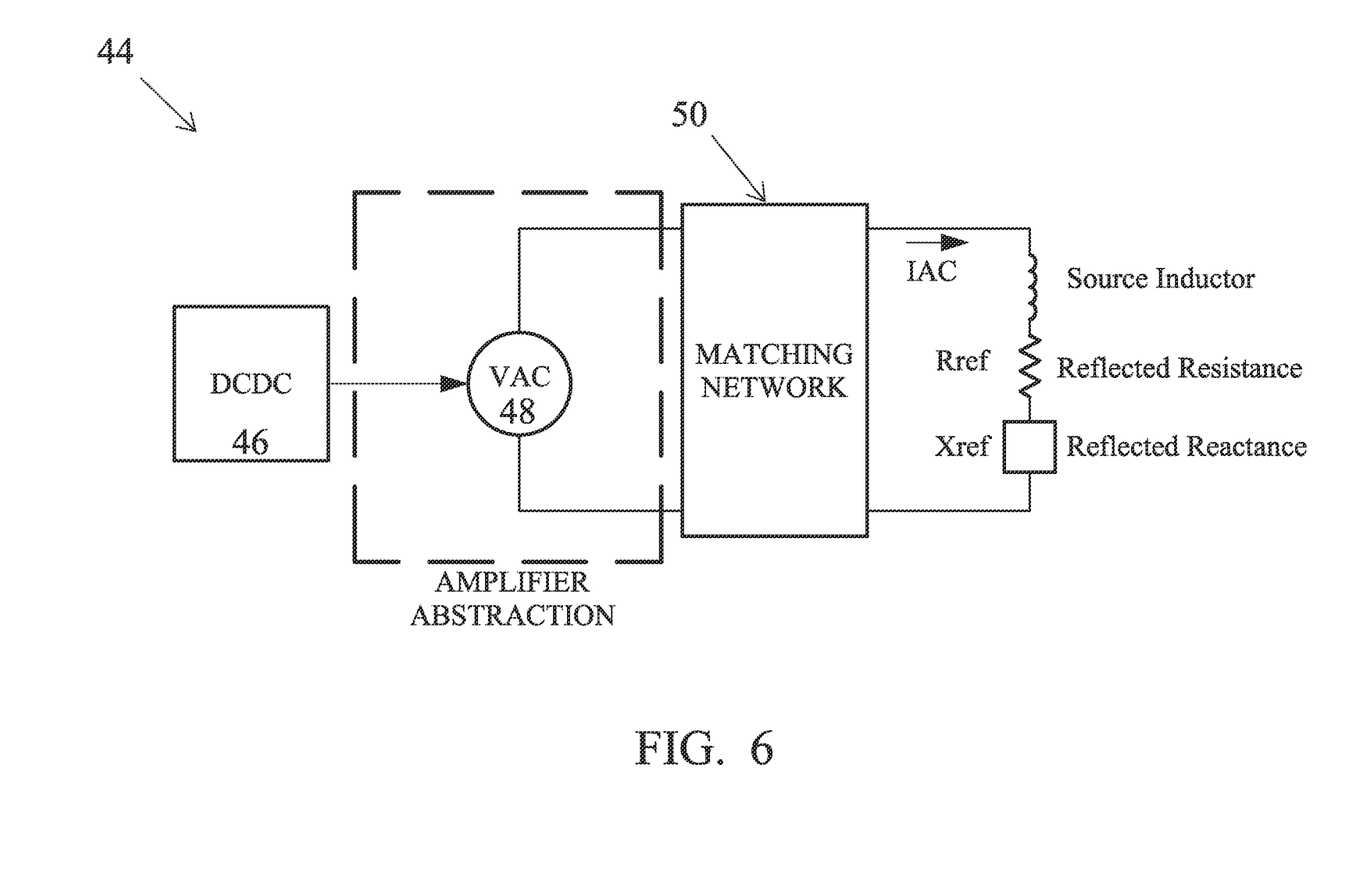
FIG. 6 is a schematic diagram illustrating a simplified source circuit used in accordance with the invention.

In particular, FIG. 6 also shows the components Rref and Xref, the reflected resistance and reactance. These elements are taken from transformer theory to model the effect of a receiver coil coupled to the source coil. Rref represents power delivered to the receiver coil, and Xref represents power reflected from the receiver coil. If the circuit 44 is perfectly matched, the impedance at the input of the matching network 50 will be exactly the real value of the equivalent source impedance with no imaginary (reactive) component. This ensures that the source can transfer maximum power to the load. However, since the input impedance to the matching network 50 is necessarily dependent on the reflected impedance, it is not possible to achieve perfect matching over all load conditions with a fixed matching network 50. The matching network 50 can also transform the real part of the reflected impedance to a larger or smaller value, depending on the topology used. This effect is used in this invention to vary the power delivered to the load via the VAC 48. The VAC is power by a DC source 46.

Figure 7:
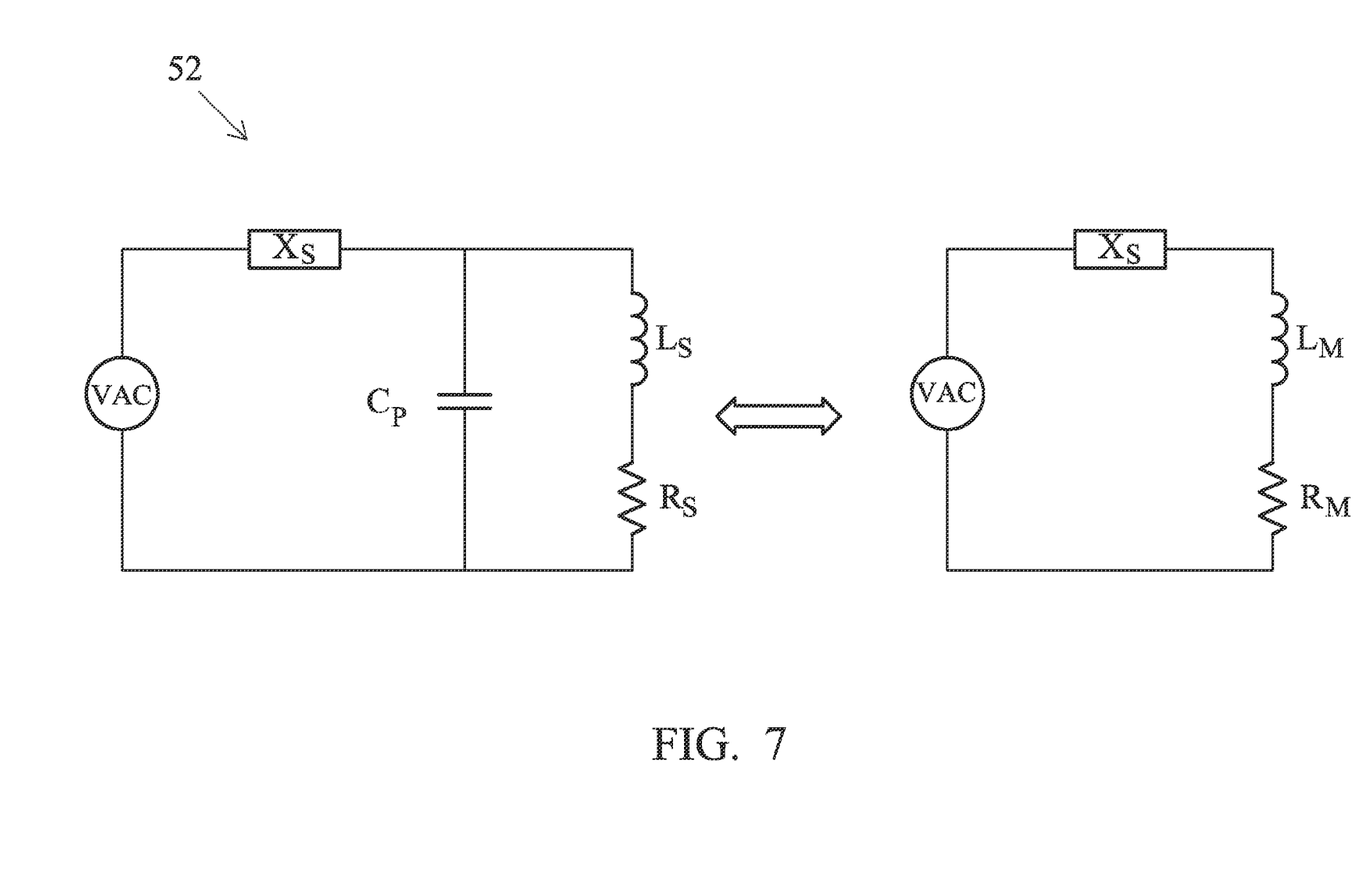
FIG. 7 is a schematic diagram illustrating a matched impedance control scheme used in accordance with the invention.

FIG. 7 illustrates a simplified block diagram of one such matched impedance control circuit 52. Vac represents the amplifier output voltage. The matching network consists of the combination of a series reactance Xs and a parallel capacitance Cp. Under certain Q factor conditions, the combination of $C_p$, $L_s$ and $R_s$ is transformed into an equivalent circuit that can be represented by $L_M$ and $R_M$. $L_M$ and $R_M$ can be calculated using equation 1 and 2 below, where ω refers to the operating frequency and $\omega_0$ is the resonant frequency of the parallel combination of $C_p$ and $L_s$.

$$L_M = \frac{L_s}{1 - \left(\frac{\omega}{\omega_0}\right)^2} \quad (1)$$

$$R_M = \frac{R_s}{\left(1 - \left(\frac{\omega}{\omega_0}\right)^2\right)^2} \quad (2)$$

$$\omega_0 = \frac{1}{2\pi\sqrt{L_s C_p}} \quad (3)$$

From Eq. 3, one can calculate the value of $C_p$ necessary to present an appropriate value of $R_M$ at the fixed AC voltage VAC. From Eq. 1, one can calculate the value of $X_S$ necessary to cancel the reactance presented by $L_M$.

It can be observed that the value of the equivalent resistance $R_M$ and inductance Lm can be varied by changing Xs and Cp. If both are varied, the amplifier can deliver varying amounts of power in a perfectly matched condition. If only one or the other is varied, perfect matching may not be maintained, but the output power can be modulated.

Figure 8:
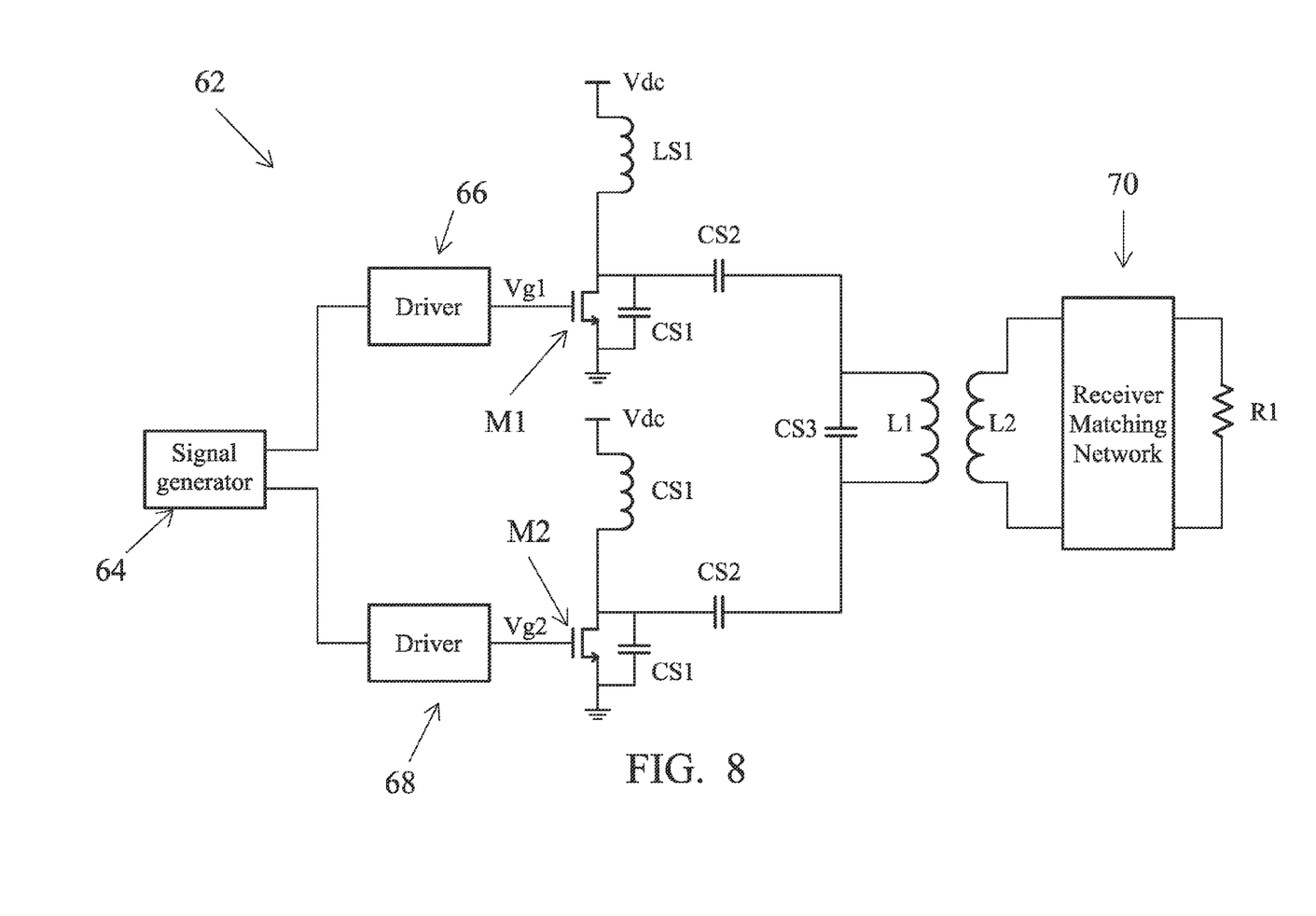
FIG. 8 is a schematic diagram illustrating a RWP system focusing on the differential Class-E amplifier used in accordance with the invention.

FIG. 8 shows a schematic of a RWP system 62, in which a differential Class-E amplifier is used. The techniques described above are particularly well-suited to RWP systems including differential Class-E amplifiers. Class-E amplifiers are often used in RWP systems because they offer high efficiency and low equivalent output resistance. A description of the circuit is as follows: A signal generator 64 produces two frequency references with fixed frequency and duty cycle and opposite phase. Driver stages 66 and 68 amplify the frequency references with sufficient drive strength to control the gates of the power FETs M1 and M2. The FETs are arranged with a conventional Class-E matching network consisting of choke inductors LS1 and capacitors CS1 and CS2. The amplifier produces a sinusoidal circulating current in L1, the source coil. This generates a magnetic field that induces a voltage in the receiver coil L2. This induced voltage can be used to transfer energy to the receiver load, represented as resistor R1. A matching network 70 provides maximum power transfer between the source or RF energy and its load.

Although the present invention has been shown and described with respect to several preferred embodiments thereof, various changes, omissions and additions to the form and detail thereof, may be made therein, without departing from the spirit and scope of the invention.

Another method of adjusting output power is to provide some fine adjustment on the phase angle of the gate drive waveforms Vg1 and Vg2. In one extreme, when the phases are separated by 180 degrees, the drive coil is driven with a fully differential signal and output power is maximized. In the other extreme, when Vg1 and Vg2 are exactly in phase, there is no differential voltage across the coil and output power is zero. For phases in between 0 and 180, the output power varies between zero and the maximum power level. Unlike burst-mode control, no excess harmonics are generated. However, the gate-drive power is higher than in burst mode because the full rate of gate transitions is always generated.

What is claimed is:

1. A wireless power (WP) system comprising:
   a signal generator that provides an input signal waveform; and
   an amplifier structure powered from a voltage supply, wherein the amplifier structure is arranged to be operated (1) switching between operating as a differential amplifier and operating as a single ended amplifier to provide a first output power level when operating as a differential amplifier and a second output power level when operating as a single ended amplifier, (2) as a differential amplifier in burst mode to provide a range of output power levels, or (3) with a phase angle of the input signal waveform adjusted to provide a range of output power levels.

2. The WP system of claim 1, wherein the amplifier structure has the effect of varying the power levels to a load.

3. The WP system of claim 1, wherein amplifier structure comprises Class-D, E, or F amplifiers.

4. The WP system of claim 1, wherein the amplifier structure does not use duty-cycle control, frequency variation or a dc-dc converter.

5. The WP system of claim 1, wherein the amplifier structure is arranged to be operated (1) switching between operating as a differential amplifier and operating as a single ended amplifier to provide a first output power level when operating as a differential amplifier and a second output power level when operating as a single ended amplifier.

6. The (WP) system of claim 5, wherein the first output power level is double the second output power level.

7. The (WP) system of claim 1, wherein the amplifier structure is arranged to be operated (2) as a differential amplifier in burst mode to provide a range of output power levels.

8. The WP system of claim 1, wherein the signal generator adjusts the phase angle of the input signal waveform between 0 and 180 degrees, and the amplifier structure is arranged to be operated to provide an output power level varying according to the adjusted phase angle.

9. A method of controlling the power of a wireless power (WP) system comprising:
   providing a signal generator that provides an input signal waveform; and
   providing an amplifier structure that is powered from a voltage supply, wherein the amplifier structure is arranged to be operated (1) switching between operating as a differential amplifier or as a single ended amplifier to provide a first output power level when operating as a differential amplifier and a second output power level when operating as a single ended amplifier, (2) as a differential amplifier in burst mode to provide a range of output power levels, or (3) with a phase angle of the input signal waveform adjusted to provide a range of output power levels.

10. The method of claim 9, wherein the amplifier structure has the effect of varying the power levels to a load.

11. The method of claim 9, wherein amplifier structure comprises Class-D, E, or F amplifiers.

12. The method of claim 9, wherein the amplifier structure does not use duty-cycle control, frequency variation or a dc-dc converter.

13. The method of claim 9, wherein the amplifier structure is arranged to be operated (1) switching between operating as a differential amplifier and operating as a single ended amplifier to provide a first output power level when operating as a differential amplifier and a second output power level when operating as a single ended amplifier.

14. The method of claim 13, wherein the first output power level is double the second output power level.

15. The method of claim 9, wherein the amplifier structure is arranged to be operated (2) as a differential amplifier in burst mode to provide a range of output power levels.

16. The method of claim 9, wherein the signal generator adjusts the phase angle of the input signal waveform between 0 and 180 degrees, and the amplifier structure is arranged to be operated to provide an output power level varying according to the adjusted phase angle.

* * * * *